(12) United States Patent
Watanabe et al.

(10) Patent No.: US 9,966,146 B2
(45) Date of Patent: May 8, 2018

(54) MEMORY SYSTEM AND METHOD OF CONTROLLING NON-VOLATILE MEMORY

(71) Applicant: Toshiba Memory Corporation, Minato-ku (JP)

(72) Inventors: Daiki Watanabe, Yokohama (JP); Hiroshi Sukegawa, Nerima (JP); Hiroshi Yao, Yokohama (JP); Tokumasa Hara, Kawasaki (JP); Naomi Takeda, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 320 days.

(21) Appl. No.: 14/636,321

(22) Filed: Mar. 3, 2015

(65) Prior Publication Data

US 2016/0049204 A1    Feb. 18, 2016

Related U.S. Application Data

(60) Provisional application No. 62/036,686, filed on Aug. 13, 2014.

(51) Int. Cl.
*G11C 29/00* (2006.01)
*G11C 16/26* (2006.01)
(Continued)

(52) U.S. Cl.
CPC .......... *G11C 16/26* (2013.01); *G06F 11/1048* (2013.01); *G11C 11/5642* (2013.01);
(Continued)

(58) Field of Classification Search
CPC ..... G11C 16/26; G11C 11/5642; G11C 29/52; G11C 8/12; G11C 2029/0411; G06F 11/1048
See application file for complete search history.

(56) References Cited

U.S. PATENT DOCUMENTS 7,349,260 B2   3/2008   Guterman
7,405,975 B2   7/2008   Hosono
(Continued)

FOREIGN PATENT DOCUMENTS

JP   2007-164892   6/2007
JP   4892566   3/2012
(Continued)

*Primary Examiner* — Christine T. Tu
(74) *Attorney, Agent, or Firm* — Oblon, McClelland, Maier & Neustadt, L.L.P.

(57) ABSTRACT

According to one embodiment, a controller groups a plurality of memory cells in each of the pages into a plurality of groups. The plurality of groups includes a first group and a second group. In a case of reading data from a first page, The controller performs first reading. The first reading includes reading data from the first page by using a first operation parameter for the first group. The controller performs second reading. The second reading includes reading data from the first page by using a second operation parameter for the second group. The controller merges first read data and second read data, and return the merged data as read data read from the first page. The first read data is acquired by the first reading. The second read data is acquired by the second reading.

20 Claims, 7 Drawing Sheets

(51) Int. Cl.
  *G11C 29/52*   (2006.01)
  *G11C 11/56*   (2006.01)
  *G06F 11/10*   (2006.01)
  *G11C 8/12*    (2006.01)
  *G11C 29/04*   (2006.01)

(52) U.S. Cl.
  CPC ............... *G11C 29/52* (2013.01); *G11C 8/12* (2013.01); *G11C 2029/0411* (2013.01)

(56) References Cited

U.S. PATENT DOCUMENTS

| | | |
|---|---|---|
| 8,498,152 B2 | 7/2013 | Alrod et al. |
| 8,599,619 B2 | 12/2013 | Fukuda |
| 2012/0084490 A1 | 4/2012 | Choi et al. |
| 2014/0010020 A1 | 1/2014 | Fukuda |
| 2014/0281762 A1* | 9/2014 | Norrie ................. G06F 11/2215 714/703 |

FOREIGN PATENT DOCUMENTS

| | | |
|---|---|---|
| JP | 2012-69192 | 4/2012 |
| JP | 2012-79403 | 4/2012 |
| WO | WO 2007/079124 A1 | 7/2007 |
| WO | WO 2012/087815 A1 | 6/2012 |

* cited by examiner

MEMORY SYSTEM AND METHOD OF CONTROLLING NON-VOLATILE MEMORY

CROSS-REFERENCE TO RELATED APPLICATIONS

This application is based upon and claims the benefit of priority from U.S. Provisional Application No. 62/036,686, filed on Aug. 13, 2014; the entire contents of which are incorporated herein by reference.

FIELD

Embodiments described herein relate generally to a memory system including a non-volatile memory and a method of controlling a non-volatile memory.

BACKGROUND

In a storage system including a non-volatile memory such as a flash memory, reading of data is performed in a page unit. The page includes a plurality of memory cells. For example, a NAND-type flash memory to store information by using a floating gate, information is stored with a charge amount stored in a floating gate of each memory cell. The stored information can be read out using a result of applying a read voltage to the memory cell. A distribution of the charge amount stored in the floating gate of each memory cell varies due to various factors. Thus, an error may be generated in the read data.

DETAILED DESCRIPTION

According to the present embodiment, the memory system includes a non-volatile memory and a controller. The non-volatile memory includes a plurality of pages. Each of the pages includes a plurality of memory cells. Each of the pages is a unit of data reading. The controller groups a plurality of memory cells in each of the pages into a plurality of groups. The plurality of groups includes a first group and a second group. In a case of reading data from a first page, The controller performs first reading. The first reading includes reading data from the first page by using a first operation parameter for the first group. The controller performs second reading. The second reading includes reading data from the first page by using a second operation parameter for the second group. The controller merges first read data and second read data, and return the merged data as read data read from the first page. The first read data is acquired by the first reading. The second read data is acquired by the second reading.

In the following, a memory system and a method of controlling a non-volatile memory according to an embodiment will be described in detail with reference to the attached drawings. Note that the present invention is not limited to these embodiments.

First Embodiment

Figure 1:
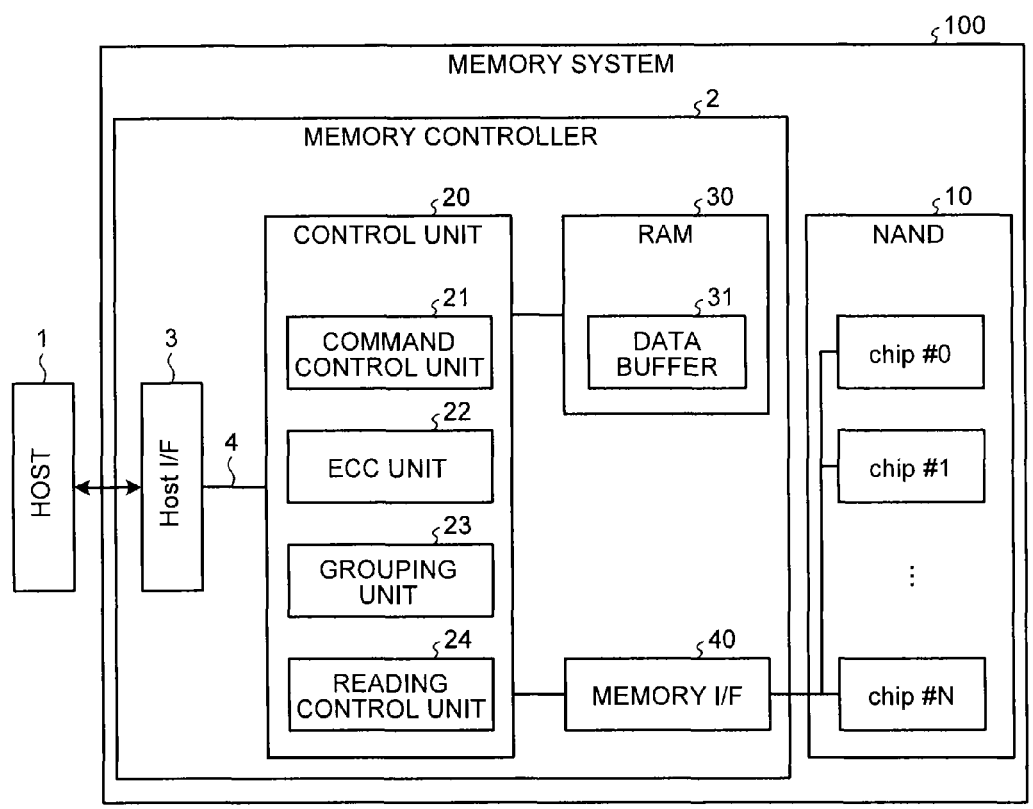
FIG. 1 is a functional block diagram illustrating an inner configuration of a memory system.

FIG. 1 is a block diagram illustrating a configuration example of a memory system 100 of a first embodiment. The memory system 100 includes a memory controller 2, and a NAND flash (hereinafter, simply referred to as NAND) 10 as a non-volatile memory. The non-volatile memory may be a memory other than the NAND, such as a flash memory having a three-dimensional structure, a resistance random access memory (ReRAM), or a ferroelectric random access memory (FeRAM).

The memory system 100 is connected to a host apparatus (hereinafter, simply referred to as host) 1 through a host interface 3 and functions as an external storage apparatus of the host 1. The host 1 is, for example, a personal computer, a mobile phone, or an imaging apparatus.

Figure 2:
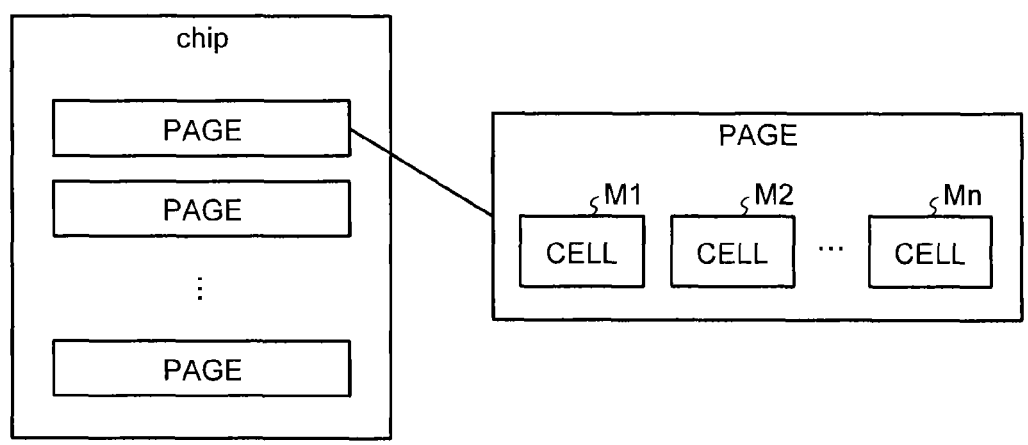
FIG. 2 is a view illustrating a configuration inside a memory chip.

The NAND 10 includes one or more memory chips. Each memory chip includes a memory cell array in which a plurality of memory cells is arrayed in a matrix. As illustrated in FIG. 2, each memory chip includes a plurality of pages. Each page includes a plurality of (number being n) memory cells M1 to Mn. The page is a unit of data writing. The page is a unit of data reading.

The memory controller 2 includes the host interface 3, a control unit 20, a RAM 30, and a memory interface 40. The host I/F 3 outputs, to an internal bus 4, a command, user data (write data), and the like received from the host 1. Also, the host I/F 3 transmits, to the host 1, user data read from the NAND 10, a response from the control unit 20, and the like. Based on an instruction from the control unit 20, the memory I/F 40 controls processing to write/read user data or the like into/from the NAND 10.

The RAM 30 is a volatile semiconductor memory which can perform faster access than the NAND 10. The RAM 30 includes a storage region as a buffer memory 31. The buffer memory 31 temporarily stores data received from the host 1 before writing the data into the NAND 10 and temporarily stores data read from the NAND 10 before transmitting the data to the host 1. The RAM 30 temporarily stores management information to manage data stored in the NAND 10. The management information managed in the RAM 30 is backed-up in the NAND 10. As a RAM 30, a static random access memory (SRAM) or a dynamic random access memory (DRAM) is used.

The control unit 20 controls the memory system 100 as a whole. A function of the control unit 20 is realized by a processor to execute firmware stored in the NAND 10, various hardware circuits, and the like. When receiving a command from the host 1 through the host I/F 3, the control unit 20 performs control corresponding to the command. The control unit 20 receives a command control unit 21, an ECC unit 22, a grouping unit 23, and a reading control unit 24.

The command control unit 21 performs processing corresponding to the command received from the host 1. For example, when receiving a write request from the host 1, the command control unit 21 instructs the ECC unit 22 to encode write data. Also, the command control unit 21 instructs the memory I/F 40 to write a code word generated by the ECC unit 22 into the NAND 10. Also, when receiving a read request from the host 1, the command control unit 21 instructs the memory I/F 40 to read the code word from the NAND 10. Also, the command control unit 21 instructs the ECC unit 22 to decode the code word read from the NAND 10. The command control unit 21 manages management information including a relationship between a logical address specified by the host 1 and a storage location (physical address) on a NAND 10.

The ECC unit 22 generates a code word by encoding user data. The ECC unit 22 decodes the code word. As an encoding method performed by the ECC unit 22, low density parity check (LDPC) encoding can be used. An encoding method is not limited to the LDPC and a different arbitrary encoding method can be employed.

The reading control unit 24 executes selection processing of an optimal operation parameter (reading parameter) for reading of the NAND 10. Here, as an operation parameter, a read voltage is controlled optimally. In the NAND 10, in the writing of data, the number of electrons (charge amount) in a floating gate is controlled according to a value of written data and an electron is injected in such a manner that a threshold voltage of a memory cell corresponds to any of a plurality of distributions (threshold distribution). Here, to simplify the description, an example of one bit/cell in which one memory cell stores one bit will be described. In a case of one bit/cell, one of two distributions corresponds to "0" and the other corresponds to "1". When voltage is applied to a memory cell, in a case where voltage equal to or higher than a charge amount of the memory cells is applied, current flows and in a case where voltage lower than the voltage is applied, current does not flow. Thus, the voltage to be a boundary is determined for each memory cell according to a charge amount of the memory cell. Here, the voltage determined according to the charge amount of the memory cell is called a threshold voltage. Thus, by injecting charge in such a manner as to correspond to either of the two threshold distributions in an initial state and by applying, to the memory cell, a reference read voltage which separates the two threshold distributions from each other in reading, it is possible to determine whether data stored in the memory cell is one.

On the other hand, in the NAND 10, there are error factors such as a data retention error, a reading disturbance error, a program disturbance trouble, and the like. Due to these error factors, a charge amount in the floating gate varies. Thus, when reading is performed by using the reference read voltage set initially, a reading error can be generated.

Figure 3:
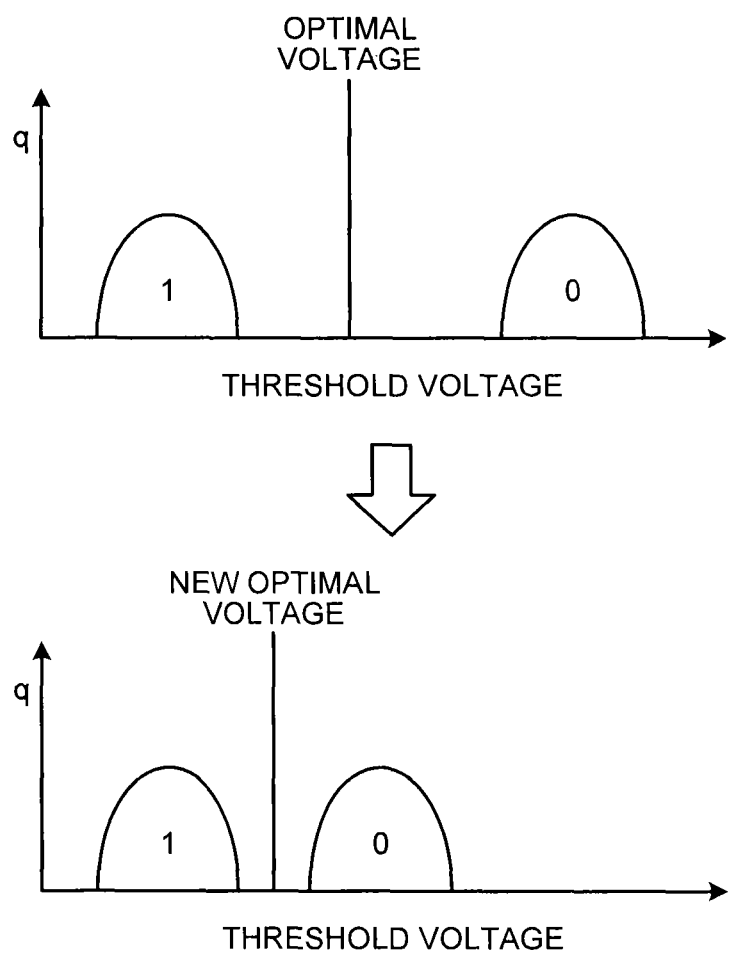
FIG. 3 is a view illustrating an example of a variation and a distribution of a threshold voltage.
Figure 4:
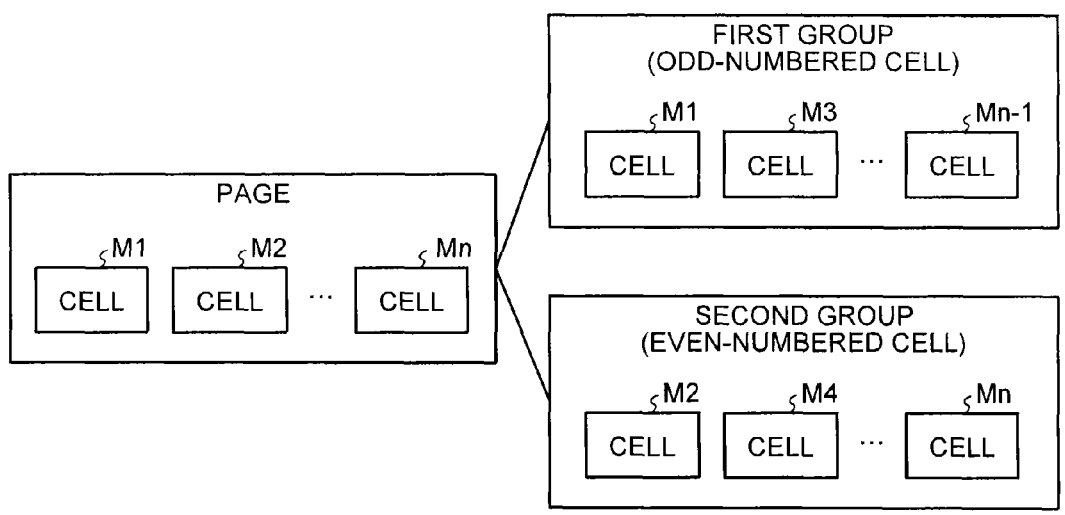
FIG. 4 is a view illustrating a group configuration inside a page.

FIG. 3 is a view illustrating an example of a variation and a distribution of the threshold voltage. An upper view in FIG. 3 illustrates a distribution in an initial state. A vertical axis indicates a frequency q and a horizontal axis indicates a threshold voltage. A peak on the left side indicates a distribution corresponding to "0" and a peak on the right side indicates a distribution corresponding to "1". In the initial state, for example, when a middle of the two distributions is set as a read voltage, reading can be performed without an error. A lower view in FIG. 3 illustrates a varied state of the distribution. In such a manner, when the distribution varies, an error may be generated in a case where reading is performed by using the read voltage in the initial state.

To reduce a reading error, it is preferable to perform reading with an optimal read voltage corresponding to a distribution at the time point. As a method to search for an optimal read voltage Vth, there is a method to perform reading with m read voltages and to use a waveform of a threshold voltage distribution acquired from the read data. In the present embodiment, this method will be called Vth Tracking. In the Vth Tracking, the number of memory cells between two read voltages is calculated as a frequency. When m read voltages are used, m+1 frequencies can be acquired. Then, by performing filter calculation on the m+1 frequencies, shapes of the peak and a valley of the distribution are calculated. Then, a read voltage corresponding to the minimum value of the valley is set as an optimal read voltage. As illustrated in the lower side in FIG. 3, the reading control unit 24 searches for an optimal read voltage by using such Vth Tracking.

The grouping unit 23 classifies a plurality of memory cells in each page of the NAND 10 into a plurality of groups according to data retention characteristics thereof. That is, the grouping unit 23 manages which group the plurality of memory cells in each page belongs to among the plurality of groups. As illustrated in FIG. 2, one page of the NAND 10 includes a plurality of memory cells M1 to Mn. The plurality of memory cells in each page of the NAND 10 respectively includes different data retention characteristics and can be classified into a plurality of groups. For example, as illustrated in FIG. 3, the plurality of memory cells in each page can be classified into two groups which are an odd-numbered memory cell (first group) having an odd-numbered address in a page (bit position in page) and an even-numbered memory cell (second group) having an even-numbered address in a page. These two groups have different data retention characteristics.

In a case where the plurality of memory cells in each page is classified into a plurality of groups according to data retention characteristics thereof, even when an operation parameter is optimized in a page unit, an operation parameter for each memory cell in the page may not be optimized. Thus, in the present embodiment, reading from a page is executed by using an operation parameter optimized for one of a plurality of groups in the page. Also, in the present embodiment, reading from a page is executed by using a first read voltage optimized for a first group in the page, and then, reading from the page is executed by using a second read voltage optimized for a second group in the page. Similar processing is executed for all the groups in the page. Then, by merging pieces of read data of the plurality of groups, data of one page is created.

Figure 5:
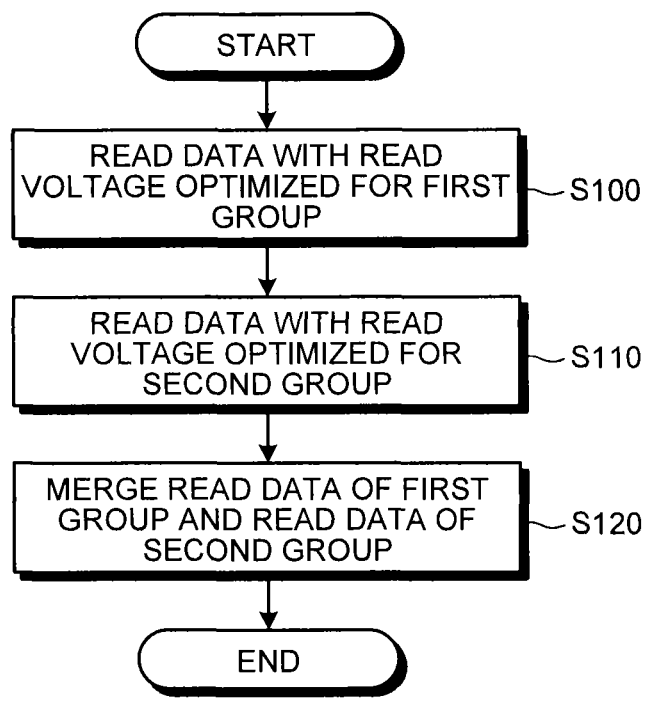
FIG. 5 is a flowchart illustrating reading processing of a first embodiment.
Figure 6:
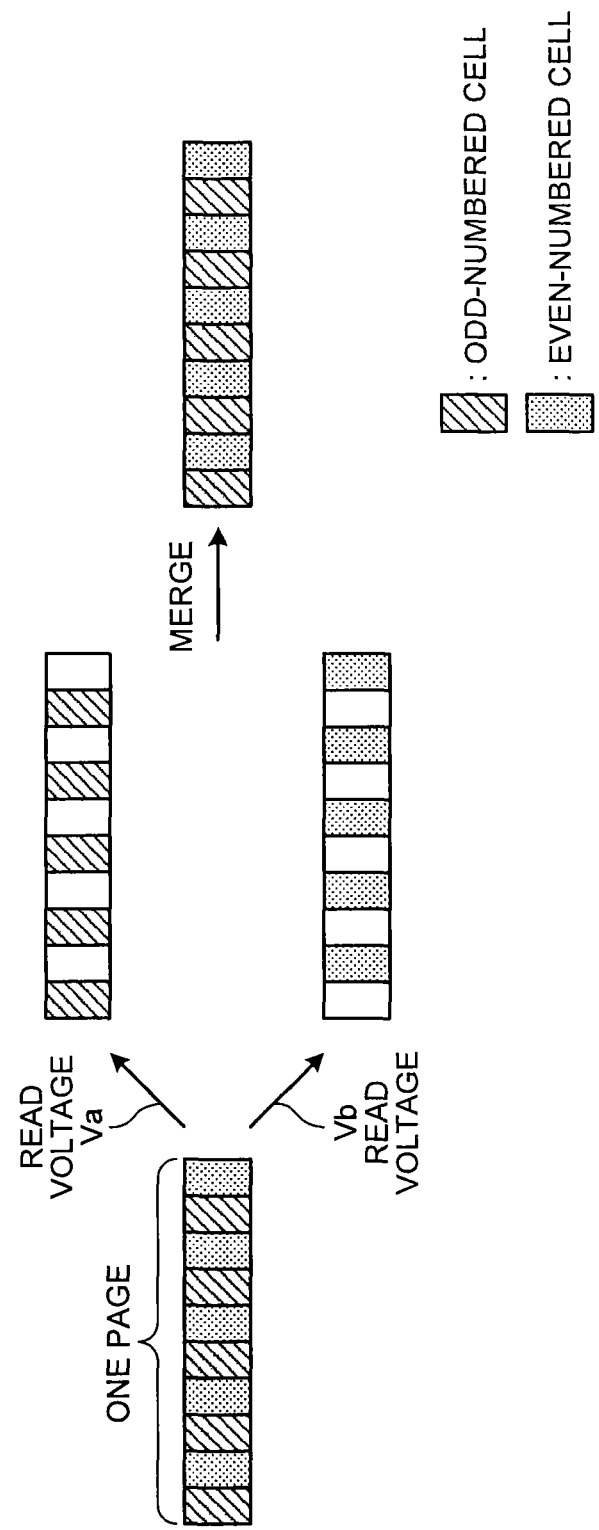
FIG. 6 is a conceptual diagram illustrating the reading processing of the first embodiment.

FIG. 5 is a flowchart illustrating reading processing of the memory system 100 of the first embodiment. FIG. 6 is a conceptual diagram illustrating the reading processing of the memory system 100 of the first embodiment. When a read request is generated in the host 1, the command control unit 21 acquires a physical address (page address) corresponding to a logical address specified by the read request. Also, the command control unit 21 acquires a group configuration of a page to be read from the grouping unit 23. In the present embodiment, as illustrated in FIG. 6, it is assumed that memory cells in each page are classified into the first group including an odd-numbered cell and the second group including an even-numbered cell.

Here, it is assumed that the first group including an odd-numbered cell has a weak resistance characteristic to the reading disturbance error and the second group including an even-numbered cell has a weak resistance characteristic to the data retention error. Usually, in the reading disturbance error, a charge amount of a memory cell is increased and in the data retention error, a charge amount of a memory cell is decreased. Accordingly, it is likely that an optimal read voltage is in a relatively high voltage range in the first group and an optimal read voltage is in a relatively low voltage range in the second group. In the grouping unit 23, a search range of a read voltage in the Vth Tracking is set for each group in each page. A search range of the first group is set higher than a search range of the second group.

First, the command control unit 21 gives instruction to the reading control unit 24 on a page address to be read, performing the Vth Tracking of the first group, and a search range of a read voltage for the first group. Here, to simplify the description, it is assumed that the page to be read is one page. While reading data from the page to be read of the NAND 10 by controlling the memory I/F 40, the reading control unit 24 performs the Vth Tracking by using a read voltage within the instructed search range and searches for an optimal read voltage for the first group. When acquiring the optimal read voltage Va for the first group, the reading control unit 24 reads data from the page to be read by using the read voltage Va (step S100). The reading control unit 24 loads the read data of one page into the RAM 30.

Then, the command control unit 21 gives instruction to the reading control unit 24 on a page address to be read, performing the Vth Tracking of the second group, and a search range of a read voltage for the second group. While reading data from the page to be read of the NAND 10 by controlling the memory I/F 40, the reading control unit 24 performs the Vth Tracking within the instructed search voltage range and searches for an optimal read voltage for the second group. When acquiring the optimal read voltage Vb for the second group, the reading control unit 24 reads data from the page to be read by using the read voltage Vb (step S110). The reading control unit 24 loads the read data of one page into the RAM 30.

In such a manner, data Da of one page which data is read with the optimal read voltage Va of the first group and data Db of one page which data is read with the optimal read voltage Vb of the second group are loaded into the RAM 30. As illustrated in FIG. 6, by extracting data of an odd-numbered cell from the data Da and data of an even-numbered cell from the data Db and by merging these pieces of extracted data, the reading control unit 24 creates data of one page to be read (step S120).

The reading control unit 24 inputs the created data of one page into the ECC unit 22. The ECC unit 22 decodes the input read data. The command control unit 21 transmits the decoded data to the host 1 through the host interface 3.

In such a manner, in the first embodiment, a plurality of memory cells in each page is classified into a plurality of groups and reading from the page is performed by using an optimal operation parameter (reading parameter) for each group. Also, by merging pieces of the read page data of one page, data of one page is configured. Thus, even when there is a plurality of groups having different data retention characteristics in a page, reading with few errors can be performed.

Second Embodiment

Figure 7:
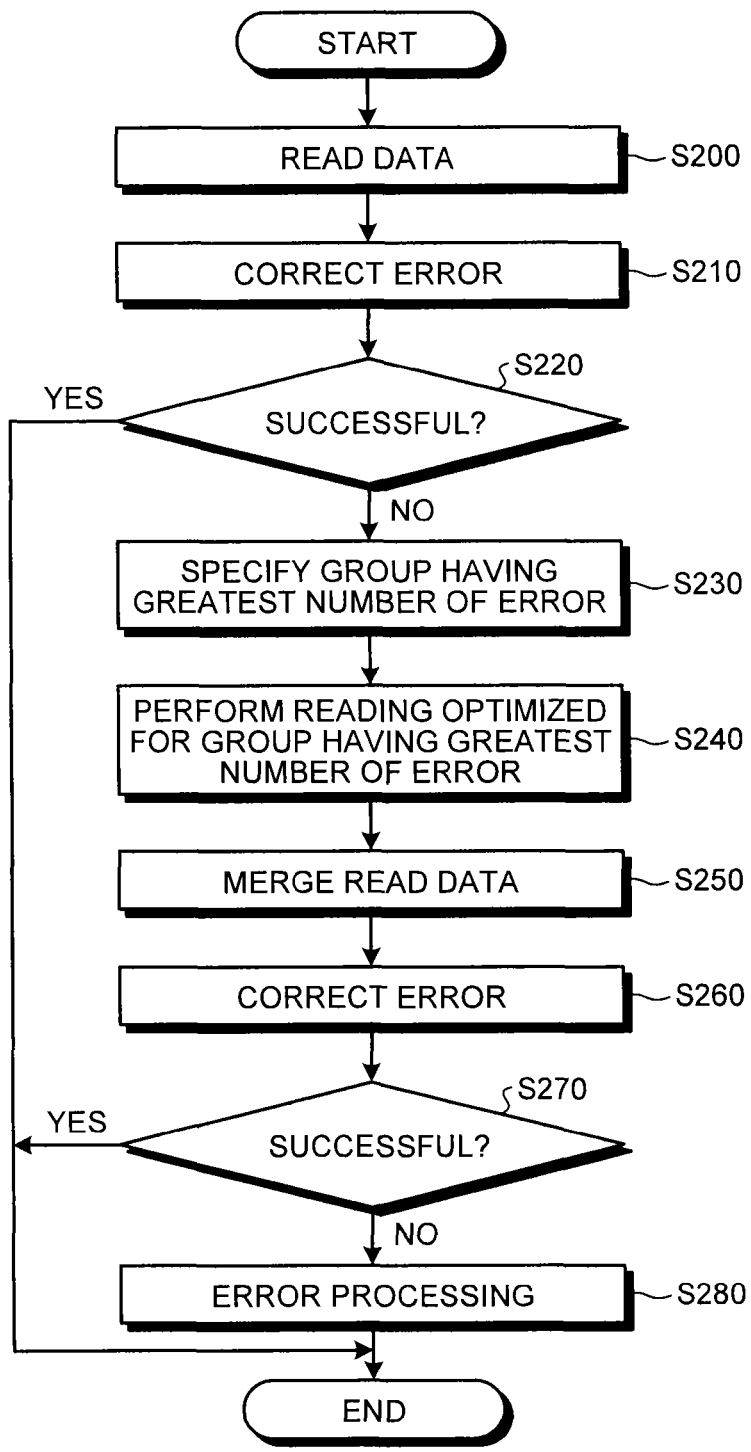
FIG. 7 is a flowchart illustrating the reading processing of the second embodiment.

FIG. 7 is a flowchart illustrating reading processing of a memory system 100 of the second embodiment. First, when performing reading from a NAND 10, a control unit 20 performs the reading by using an optimal operation parameter for a certain group in a page (step S200). For example, it is assumed that groups in the page are classified into a first group including an odd-numbered cell and a second group including an even-numbered cell. Similarly to the above, a reading control unit 24 performs Vth Tracking suitable for the first group and searches for an optimal read voltage Va for the first group. Then, the reading control unit 24 reads data from the page to be read by using the read voltage Va. The read data of one page is input into an ECC unit 22 through a memory I/F 40. The ECC unit 22 decodes the input read data and performs error correction (step S210). When the error correction is successful (step S220: Yes), the control unit 20 ends the reading processing of this page.

However, when the error correction in step S210 is unsuccessful (step S220: No), the reading control unit 24 estimates a group having the greatest number of errors from the plurality of groups in the page (step S230). In the determination, for example, one of the following three methods is employed. Also, the ECC unit 22 loads data, which is not decoded yet, into a RAM 30.

In the first method, a group having the greatest number of errors is estimated from groups other than one group which is an object of optimization in step S200. For example, in a case where groups in the page is classified into the first group including an odd-numbered cell and the second group including an even-numbered cell and when the first group is selected as the object of the optimization in step S200, it is estimated that the second group including an even-numbered cell is the group having the greatest number of errors.

In the second method, a group having the greatest number of errors is estimated based on information acquired in decoding in error correction in the ECC unit 22. For example, by encoding data corresponding to the first group including an odd-numbered cell and data corresponding to the second group including an even-numbered cell separately and by performing error correction separately on the first group and the second group, information for estimating the group having the greatest number of errors can be acquired.

In the third method, a group having the greatest number of errors is selected based on a ratio between zero and one in read data. In writing of data, technique which is to substantially equalize the number of pieces of data 0 and data 1 and is called randomization may be employed. Normally, in randomized page data, bit data of zero and that of one are included substantially in the same ratio. Thus, by searching for a data ratio between zero and one of each group in a page, it is possible to estimate that a group, in which one side of the data ratio between zero and one included in the group is higher, is the group having the greatest number of errors.

In such a manner, when the group having the greatest number of errors is estimated, the reading control unit 24 performs reading by using an optimal operation parameter for the estimated group (step S240). For example, it is assumed that the second group including an even-numbered cell is estimated as the group having the greatest number of errors. Similarly to the above, the reading control unit 24 performs Vth Tracking suitable for the second group and searches for an optimal read voltage Vb for the second group. Then, the reading control unit 24 reads data from the page to be read by using the read voltage Vb. The read page data is loaded into the RAM 30.

Data Da of one page which data is read with the optimal read voltage Va of the first group and data Db of one page which data is read with the optimal read voltage Vb of the second group are loaded into the RAM 30. By extracting data of an even-numbered cell from the data Db and by merging the extracted data to the data Da, the reading control unit 24 creates data of one page to be read (step S250).

The reading control unit 24 inputs the merged page data into the ECC unit 22. The ECC unit 22 decodes the input page data and performs error correction (step S260). When the error correction is successful (step S270: Yes), the control unit 20 ends the reading processing of this page.

However, when the error correction in step S270 is unsuccessful (step S270: No), the control unit 20 performs, for example, reading error processing (step S280).

In such a manner, in the second embodiment, reading of page data is performed by using an operation parameter optimized for a certain group in a page. When error correction processing of the read data is unsuccessful, a group having the greatest number of errors is estimated and reading of page data is performed by using an operation parameter optimized for the estimated group. Accordingly, with a few number of times of reading, reading with few errors is performed effectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory including one or more memory chips, each of the memory chips including a plurality of pages, each of the pages including a plurality of memory cells, each of the pages being a unit of data reading; and
a controller configured to
group the plurality of memory cells in each of the pages into a plurality of groups, the plurality of groups including a first group and a second group,
in a case of reading data from a first page among the pages,
perform first reading, the first reading including reading data from the first page by using a first operation parameter derived from a threshold voltage distribution of the memory cells of the first group,
perform second reading, the second reading including reading data from the first page by using a second operation parameter derived from a threshold voltage distribution of the memory cells of the second group, the second operation parameter being different from the first operation parameter, and
combine first read data and second read data, and set the combined data as read data read from the first page, the first read data corresponding to data of the memory cells of the first group among data acquired by the first reading, the second read data corresponding to data of the memory cells of the second group among data acquired by the second reading.

2. The memory system according to claim 1, wherein the non-volatile memory is a flash memory, and
the first and second operation parameter includes a read voltage.

3. The memory system according to claim 2, wherein the memory cells of the second group have different data retention characteristics than the memory cells of the first group.

4. The memory system according to claim 2, wherein the memory system is connectable to a host, and
the controller is configured to,
in a case of receiving a read request from the host, read the data from a page in which a physical address is included, the physical address corresponding to a logical address specified by the received read request.

5. A memory system comprising:
a non-volatile memory including one or more memory chips, each of the memory chips including a plurality of pages, each of the pages including a plurality of memory cells, each of the pages being a unit of data reading; and
a controller configured to
group the plurality of memory cells in each of the pages into a plurality of groups, and
perform first reading, the first reading including reading data from a first page among the pages by using a first operation parameter derived from a threshold voltage distribution of the memory cells of the first group among the plurality of groups.

6. The memory system according to claim 5, wherein the non-volatile memory is a flash memory and the operation parameter includes a read voltage.

7. The memory system according to claim 5, wherein the first page corresponds to a logical address specified by a read command from a host, and
wherein the controller is configured to
perform the first reading and second reading, the second reading including reading data from the first page by using a second operation parameter derived from a threshold voltage distribution of the memory cells of a second group among the plurality of groups, the second operation parameter being different from the first operation parameter,
combine first read data and second read data, the first read data corresponding to data of the memory cells of the first group among data acquired by the first reading, the second read data corresponding to data of the memory cells of the second group among data acquired by the second reading, and
transmit the combined data to the host.

8. The memory system according to claim 6, wherein the controller is configured to
perform error correction of the data read by the first reading,
select, when the error correction is unsuccessful, a second group which is estimated to have the greatest number of errors from the plurality of groups, and
perform second reading, the second reading being re-reading from the first page by using a read voltage for the selected second group.

9. The memory system according to claim 8, wherein the controller is configured to
combine first read data and second read data, and set the combined data as read data read from the first page, the first read data corresponding to data of the memory cells of the first group among data acquired by the first reading, the second read data corresponding to data of the memory cells of the second group among data acquired by the second reading.

10. The memory system according to claim 9, wherein the controller is configured to select the second group based on a ratio of a number of zero included in the read data to a number of one included in the read data.

11. The memory system according to claim 9, wherein the controller is configured to select the second group from groups other than the first group.

12. The memory system according to claim 9, wherein the controller is configured to select the second group based on a result of the error correction.

13. A method of controlling a non-volatile memory including one or more memory chips, each of the memory chips including a plurality of pages, each of the pages including a plurality of memory cells, each of the pages being a unit of data reading, the method comprising:
grouping the plurality of memory cells in each of the pages into a plurality of groups, and
performing first reading, the first reading including reading data from a first page among the pages by using a first operation parameter derived from a threshold voltage distribution of the memory cells of a first group among the plurality of groups.

14. The method according to claim 13, wherein the non-volatile memory is a flash memory and the operation parameter includes a read voltage.

15. The method according to claim 13, wherein the first page corresponds to a logical address specified by a read command from a host, and the method further comprising:
performing second reading, the second reading including reading data from the first page by using a second operation parameter derived from a threshold voltage distribution of the memory cells of a second group among the plurality of groups, the second operation parameter being different from the first operation parameter;
combine first read data and second read data, the first read data corresponding to data of the memory cells of the first group among data acquired by the first reading, the second read data corresponding to data of the memory cells of the second group among data acquired by the second reading; and
transmitting combined data to the host.

16. The method according to claim 13, further comprising:
performing error correction of the data read by the first reading;
selecting, when the error correction is unsuccessful, a second group which is estimated to have the greatest number of errors from the plurality of groups; and
performing second reading, the second reading being re-reading from the first page by using a read voltage for the selected second group.

17. The method according to claim 16, further comprising:
combining first read data and second read data, the first read data corresponding to data of the memory cells of the first group among data acquired by the first reading, the second read data corresponding to data of the memory cells of the second group among data acquired by the second reading; and
setting the combined data as read data read from the first page.

18. The method according to claim 17, further comprising selecting the second group based on a ratio of a number of zero included in the read data to a number of one included in the read data.

19. The method according to claim 18, further comprising selecting the second group based on a result of the error correction.

20. The method according to claim 17, further comprising selecting the second group from groups other than the first group.

* * * * *